United States Patent
Oh

(10) Patent No.: US 8,842,467 B2
(45) Date of Patent: Sep. 23, 2014

(54) MAGNETIC RANDOM ACCESS MEMORY APPARATUS, METHODS FOR PROGRAMMING AND VERIFYING REFERENCE CELLS THEREFOR

(71) Applicant: SK hynix Inc., Icheon-si (KR)

(72) Inventor: Young Hoon Oh, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/146,568

(22) Filed: Jan. 2, 2014

(65) Prior Publication Data

US 2014/0140127 A1 May 22, 2014

Related U.S. Application Data

(62) Division of application No. 13/219,612, filed on Aug. 27, 2011, now Pat. No. 8,644,056.

(30) Foreign Application Priority Data

Dec. 20, 2010 (KR) .......................... 10-2010-0130900

(51) Int. Cl.
| | |
|---|---|
| G11C 11/00 | (2006.01) |
| G11C 11/16 | (2006.01) |
| H01L 43/08 | (2006.01) |
| G11C 11/15 | (2006.01) |
| H01L 27/22 | (2006.01) |

(52) U.S. Cl.
CPC .............. *G11C 11/1675* (2013.01); *H01L 43/08* (2013.01); *G11C 11/16* (2013.01); *G11C 11/15* (2013.01); *H01L 27/228* (2013.01); *G11C 11/1677* (2013.01)
USPC ........................ 365/158; 365/145; 365/185.09

(58) Field of Classification Search
CPC ........ G11C 11/16; G11C 11/15; H01L 43/08; H01L 27/228
USPC ..................................... 365/158, 145, 189.05
See application file for complete search history.

(56) References Cited

U.S. PATENT DOCUMENTS

2004/0037112 A1 * 2/2004 Ooishi ..................... 365/185.09

* cited by examiner

*Primary Examiner* — Jason Lappas
(74) *Attorney, Agent, or Firm* — William Park & Associates Patent Ltd.

(57) ABSTRACT

A magnetic random access memory apparatus includes a memory cell array including a plurality of magnetic memory cells; a reference cell array including a pair of reference magnetic memory cells; a write driver configured to program data in the memory cell array and the reference cell array; and a first switching unit configured to form a current path which extends from a bit line connected to the write driver via the reference cell array including the pair of reference magnetic memory cells to a source line connected to the write driver or a current path which extends from a source line connected to the write driver via the reference cell array including the pair of reference magnetic memory cells to a bit line connected to the write driver.

12 Claims, 8 Drawing Sheets

<u>1</u>

US 8,842,467 B2

MAGNETIC RANDOM ACCESS MEMORY APPARATUS, METHODS FOR PROGRAMMING AND VERIFYING REFERENCE CELLS THEREFOR

CROSS-REFERENCES TO RELATED APPLICATION

This application is a divisional of U.S. application Ser. No. 13/219,612 filed on Aug. 27, 2011 which claims priority under 35 U.S.C. §119(a) to Korean application number 10-2010-0130900, filed on Dec. 20, 2010, in the Korean Intellectual Property Office, which is incorporated herein by reference in its entirety as set forth in full.

BACKGROUND

1. Technical Field

The present invention relates to a semiconductor apparatus, and more particularly, to a magnetic random access memory apparatus and methods for programming and verifying reference cells therefor.

2. Related Art

A DRAM (dynamic random access memory) has advantages in that an operation speed is high and power consumption is low and a disadvantage in that it is volatile. A flash memory has a nonvolatile characteristic in that it does not lose stored information even when power is off. The flash memory has advantages in that miniaturization is possible compared to a general hard disc, it is invulnerable to a physical impact and an access speed is high. On the contrary, the flash memory has disadvantages in that an operation speed is lower and an operation voltage is higher than the DRAM.

Recently, various memory apparatuses with advantages of the DRAM and the flash memory have been developed, and a representative example thereof is a magnetic random access memory (MRAM). The MRAM uses a change in resistance according to a change in the polarity of a magnetic substance, as a digital signal, and has an advantage in that safety becomes excellent because magnetism is used.

In general, an MRAM has bit lines, word lines and digit lines which are parallel to the word lines, and records data using a vector sum of magnetic fields which are induced when current flows simultaneously through the bit lines and the digit lines. In the MRAM, a limitation exists in decreasing the size of a cell because the digit lines are additionally needed. Also, when recording data by selecting a cell, unselected cells are likely to be exposed to magnetic fields. Due to this fact, a problem is caused in that the data storage states of the unselected cells may be inverted.

In order to solve these problems of the MRAM, a spin transfer torque magnetic random access memory (STT-MRAM) has been developed.

The STT-MRAM uses a phenomenon that, when high density current with an aligned spin direction is incident on a ferromagnetic substance, the magnetization direction of the ferromagnetic substance is aligned with the spin direction of current when the magnetization direction of the ferromagnetic substance does not correspond to the spin direction of current, that is, an STT (spin transfer torque) phenomenon. The STT-MRAM includes one selection transistor which is connected between a bit line and a source line and a magnetic tunnel junction (MTJ).

FIG. 1 is a view illustrating an exemplary MTJ which is applied to an STT-MRAM generally known in the art.

Referring to FIG. 1, a magnetic tunnel junction 1 includes a first electrode layer as a top electrode, a second electrode layer as a bottom electrode, a first magnetic layer and a second magnetic layer as a pair of magnetic layers, and a tunneling barrier layer which is formed between the pair of magnetic layers.

The first magnetic layer may be a free ferromagnetic layer in which a magnetization direction is changed depending upon the direction of current applied to the MTJ, and the second magnetic layer may be a pinned ferromagnetic layer of which magnetization direction is pinned.

The resistance value of the MTJ is changed depending upon the direction of current, by which "0" or "1" is recorded.

FIGS. 2a and 2b are views explaining a data recording principle for the MTJ.

First, FIG. 2a is a diagram for explaining a principle for recording data of a logic low level (0) in the MTJ. When it is necessary to record the data, a corresponding word line WL is enabled, and a selection transistor ST is turned on. Then, as current flows in a direction extending from a bit line BL to a source line SL, that is, as current flows from the first electrode layer as the top electrode of the MTJ to the second electrode layer as the bottom electrode of the MTJ (as indicated by the dotted arrow), the magnetization direction of the first magnetic layer as the free ferromagnetic layer and the magnetization direction of the second magnetic layer as the pinned ferromagnetic layer become parallel to each other. As a result, a low resistant state is created, and the data at this time may be defined as having a logic low level (0).

Meanwhile, FIG. 2b is a diagram for explaining a principle for recording data of a logic high level (1) in the MTJ. Similarly, the corresponding word line WL is enabled, and the selection transistor ST is turned on. Then, as current flows in a direction extending from the source line SL to the bit line BL, that is, as current flows from the second electrode layer to the first electrode layer (as indicated by the dotted arrow), the magnetization direction of the first magnetic layer and the magnetization direction of the second magnetic layer become anti-parallel to each other. As a result, the MTJ has a high resistant state, and the data at this time may be defined as having a logic high level (1).

In general, in the STT-MRAM, a reference cell is used to read the data stored in a memory cell. That is to say, by using a difference between an amount of current flowing through the memory cell to be read and an amount of current flowing through the reference cell, it is determined whether the data stored in the memory cell is in a logic low state or a logic high state.

Accordingly, precise data to serve as a reference for data reading should be recorded in the reference cell. Also, in order to determine whether the data stored in the memory cell is in a logic low state or a logic high state, a logic low state and a logic high state should be recorded in the reference cell as well.

To record precise data serving as the reference for data reading in the reference cell is regarded as an important factor which determines the operational reliability of the STT-MRAM. Therefore, reliable techniques for recording data in a reference cell and verifying recorded data are demanded in the art.

SUMMARY

In one embodiment of the present invention, a magnetic random access memory apparatus includes: a memory cell array including a plurality of magnetic memory cells; a reference cell array including a pair of reference magnetic memory cells; a write driver configured to program data in the memory cell array and the reference cell array; and a first switching unit configured to form a current path which extends from a bit line connected to the write driver via the reference cell array including the pair of reference magnetic memory cells to a source line connected to the write driver or a current path which extends from a source line connected to the write driver via the reference cell array including the pair of reference magnetic memory cells to a bit line connected to the write driver.

In another embodiment of the present invention, a magnetic random access memory apparatus includes: a reference cell array including a pair of reference magnetic memory cells; a write driver configured to program data in the reference cell array; and a first switching unit configured to form a current path in such a manner that, as current is supplied from a bit line or a source line connected to the write driver, data of a logic high state and a logic low state are respectively stored in the pair of reference magnetic memory cells.

In another embodiment of the present invention, a method for programming reference cells for a magnetic random access memory apparatus, including a first switching unit which is connected between a memory cell array having a plurality of magnetic memory cells and a write driver and a second switching unit which is connected between a reference cell array having a pair of reference magnetic memory cells and the write driver and forms or blocks a current path between the reference cell array and the write driver, includes the steps of: turning off the first switching unit and turning on the second switching unit; supplying current to flow from the write driver via the pair of reference magnetic memory cells back to the write driver; and turning off the second switching unit.

In another embodiment of the present invention, a method for verifying a reference cell for a magnetic random access memory apparatus, including a first switching unit which is connected between a memory cell array having a plurality of magnetic memory cells and a write driver and a second switching unit which is connected between a reference cell array having a pair of reference magnetic memory cells and the write driver and forms or blocks a current path between the reference cell array and the write driver, includes the steps of: programming the pair of reference magnetic memory cells by applying a first programming current; comparing a predetermined external voltage and a reference voltage which is determined depending upon amounts of current flowing through the pair of reference magnetic memory cells, and outputting a sensing signal; and determining whether to reprogram the pair of reference magnetic memory cells in response to the sensing signal.

BRIEF DESCRIPTION OF THE DRAWINGS

Features, aspects, and embodiments are described in conjunction with the attached drawings, in which.

DETAILED DESCRIPTION

Hereinafter, a magnetic random access memory apparatus and methods for programming and verifying reference cells therefor according to the present invention will be described below with reference to the accompanying drawings through exemplary embodiments.

Figure 1:
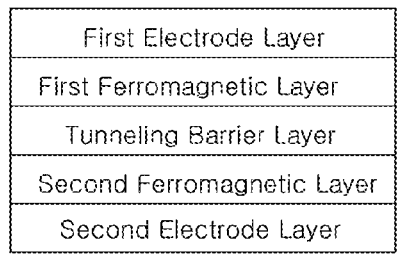
FIG. 1 is a view illustrating an exemplary MTJ which is applied to an STT-MRAM generally known in the art.
Figure 2A:
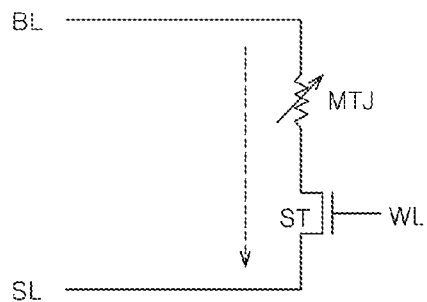
FIGS. 2a and 2b are views explaining a data recording principle for the MTJ.
Figure 2B:
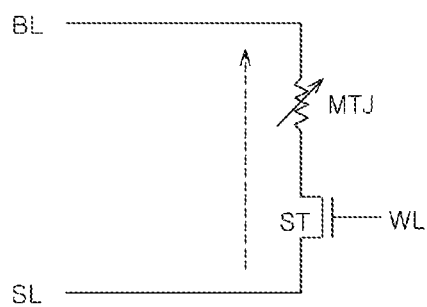
Figure 3:
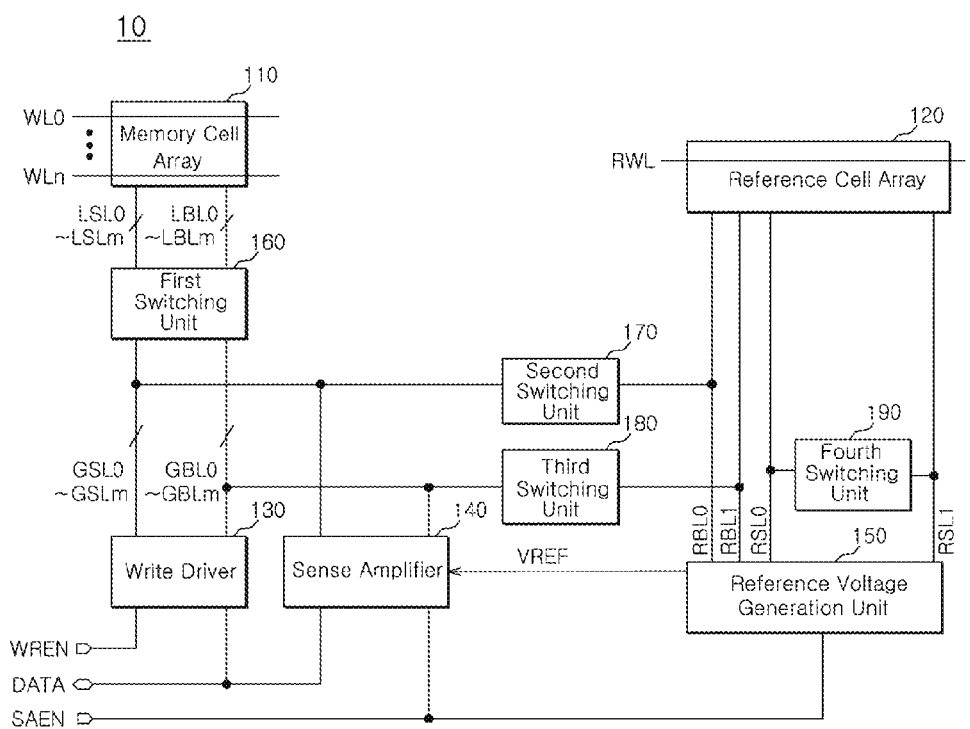
FIG. 3 is a configuration diagram illustrating a magnetic memory apparatus in accordance with an embodiment of the present invention.

FIG. 3 is a configuration diagram illustrating a magnetic memory apparatus in accordance with an embodiment of the present invention.

Referring to FIG. 3, a magnetic memory apparatus 10 includes a memory cell array 110 and a reference cell array 120. The memory cell array 110 includes a plurality of magnetic memory cells which are connected between word lines WL0 through WLn and local bit lines LBL0 through LBLm (hereinafter simplified as LBL) and local source lines LSL0 through LSLm (hereinafter simplified as LSL) which cross with the word lines WL0 through WLn. The reference cell array 120 includes a pair of reference magnetic memory cells. In detail, the reference cell array 120 includes a first reference magnetic memory cell connected between a reference word line RWL and a first reference bit line RBL0 and a first reference source line RSL0 which cross with the reference word line RWL, and a second reference magnetic memory cell connected between the reference word line RWL and a second reference bit line RBL1 and a second reference source line RSL1 which cross with the reference word line RWL.

Here, each of the magnetic memory cells includes a magnetic tunnel junction (MTJ) and a selection transistor, and the gate terminal of the selection transistor is connected to a corresponding word line.

The magnetic memory apparatus 10 is driven by a write enable signal WREN. The magnetic memory apparatus 10 further includes a write driver 130 which is configured to receive data DATA to be recorded in the memory cell array 110, be connected to the memory cell array 110 through global bit lines GBL0 through GBLm (hereinafter simplified as GBL) and global source lines GSL0 through GSLm (hereinafter simplified as GSL), and record the data DATA.

The magnetic memory apparatus 10 further includes a reference voltage generation unit 150 which is driven by a sense amplifier enable signal SAEN and is configured to provide a reference voltage VREF, determined depending upon an amount of current flowing through the reference cell array 120, to a sense amplifier 140.

The sense amplifier 140 is driven by the sense amplifier enable signal SAEN and is connected to the memory cell array 110 through the global bit line GBL and the global source line GSL. The sense amplifier 140 is configured to compare a voltage by an amount of current flowing from a bit line to a source line or from a source line to a bit line of a selected memory cell with the reference voltage VREF provided from the reference voltage generation unit 150, and read and output the data DATA.

In addition, the magnetic memory apparatus 10 further includes a first switching unit 160 which is connected between the memory cell array 110 and the write driver 130, and second through fourth switching units 170, 180 and 190 which provide current paths such that data of a logic high state and a logic low state are simultaneously recorded in the pair of respective reference cells constituting the reference cell array 120 as current is supplied from the write driver 130 through the global bit line GBL or the global source line GSL.

In detail, the second switching unit 170 is connected between the global bit line GBL and the second reference bit line RBL1, the third switching unit 180 is connected between the global source line GSL and the first reference bit line RBL0, and the fourth switching unit 190 is connected between the first reference source line RSL0 and the second reference source line RSL1.

In a reference cell programming mode for recording data of a logic high state and a logic low state in the pair of reference cells constituting the reference cell array 120, the first switching unit 160 is turned off, and the second through fourth switching units 170, 180 and 190 are turned on.

Figure 4:
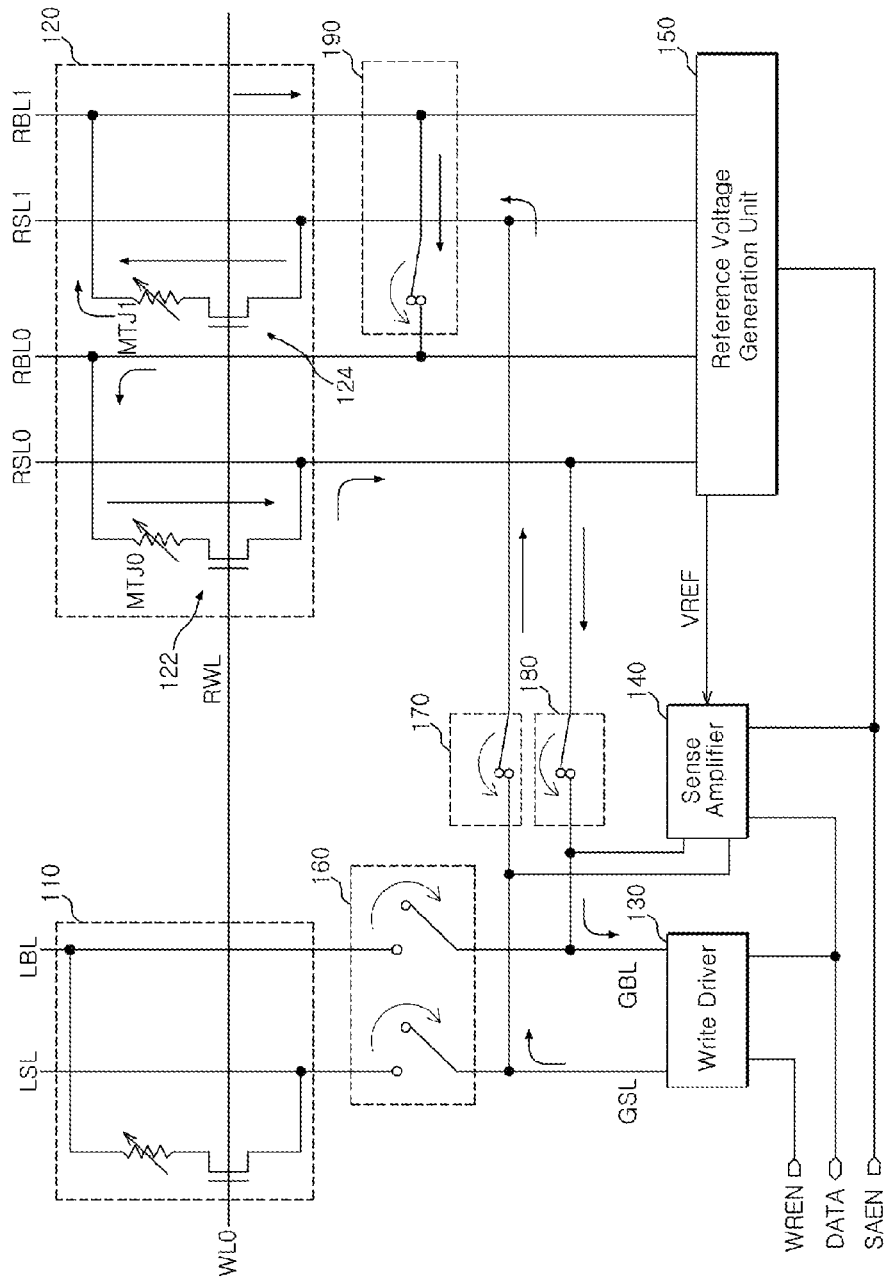
FIG. 4 is a view explaining a programming principle for reference cells in the magnetic memory apparatus in accordance with the embodiment of the present invention.

FIG. 4 is a view explaining a programming principle for reference cells in the magnetic memory apparatus in accordance with the embodiment of the present invention. In FIG. 4, the arrow indicates a direction in which current flows.

First, in order to program the references cells, the selection transistors of the reference cells are turned on by enabling the reference word line RWL. Further, the first switching unit 160 is turned off, and the second through fourth switching units 170, 180 and 190 are turned on. For example, by controlling the write driver 130, current is caused to flow from the global bit line GBL to the global source line GSL.

Then, current flows from the global bit line GBL through the second switching unit 170 to the second reference bit line RBL1. Next, current flows from the second reference bit line RBL1 to the second reference source line RSL1. As a result, data of a logic low state is recorded in a second magnetic tunnel junction MTJ1 of the second reference cell.

In succession, current flows from the second reference source line RSL1 through the fourth switching unit 190. The fourth switching unit 190 is connected between the second reference source line RSL1 and the first reference source line RSL0. Accordingly, current flows from the first reference source line RSL0 to the first reference bit line RBL0, and data of a logic high state is recorded in a first magnetic tunnel junction MTJ0 of the first reference cell.

Also, current flows from the first reference bit line RBL0 through the third switching unit 180 and the global source line GSL to the write driver 130.

In this way, it is possible to simultaneously record data of a logic high state and a logic low state in the pair of reference cells constituting the reference cell array 120.

Figure 5:
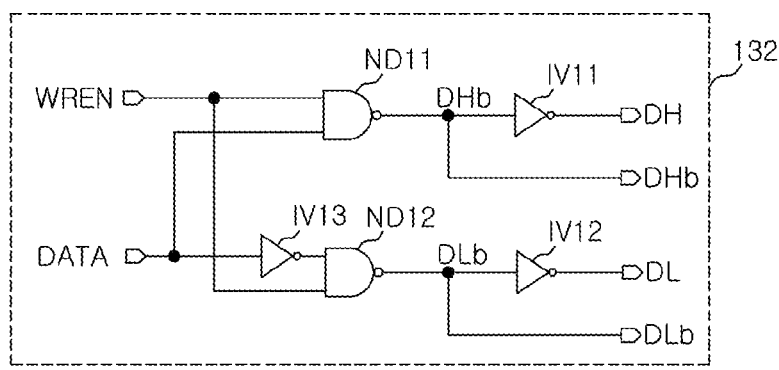
FIG. 5 is a view illustrating one exemplary embodiment of the write driver shown in FIG. 3.
Figure 5:
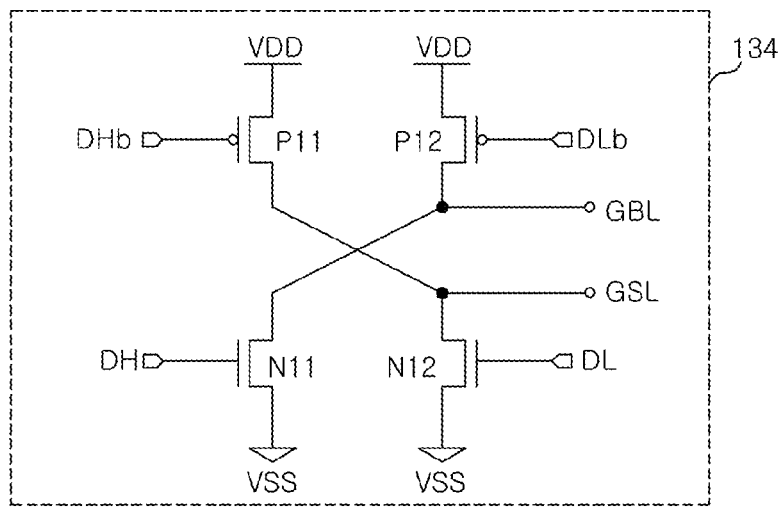

The write driver 130 for recording data of a logic high state and a logic low state in the reference cell array 120 may be configured, for example, as shown in FIG. 5.

FIG. 5 is a view illustrating one exemplary embodiment of the write driver shown in FIG. 3.

Referring to FIG. 5, the write driver 130 includes a data driving section 132 and a write control section 134.

The data driving section 132 includes a first logic stage ND11 and IV11 configured to receive the write enable signal WREN and a data signal DATA and output a first data driving signal DH of a high level when both the inputted signals have high levels, and a second logic stage ND12 and IV12 configured to receive inverted signals of the write enable signal WREN and the data signal DATA and output a second data driving signal DL of a high level when both the inputted signals have high levels. The first logic stage ND11 and IV11 may be configured by connecting serially a first NAND gate ND11 and a first inverter IV11. The second logic stage ND12 and IV12 may be configured by connecting serially a second NAND gate ND12 and a second inverter IV12.

The write control section 134 includes a first switching element P11 which is connected between a power voltage supply terminal VDD and the global source line GSL and is configured to be driven by an inverted signal DHb of the first data driving signal DH, a second switching element N12 which is connected between the global source line GSL and a ground terminal VSS and is configured to be driven by the second data driving signal DL, a third switching element P12 which is connected between the power voltage supply terminal VDD and the global bit line GBL and is configured to be driven by an inverted signal DLb of the second data driving signal DL, and a fourth switching element N11 which is connected between the global bit line GBL and the ground terminal VSS and is configured to be driven by the first data driving signal DH.

Operations of the write driver 130 having the configuration as just mentioned above will be described.

The write enable signal WREN is enabled to a high level, and the data signal DATA of a low level is inputted. Then, the first data driving signal DH is outputted at a low level, and the second data driving signal DL is outputted at a high level.

According to this fact, the first switching element P11 and the fourth switching element N11 are turned off, whereas the second switching element N12 and the third switching element P12 are turned on.

As a result, current flows through the third switching element P12 to the global bit line GBL. As shown in FIG. 4, data of a high level is recorded in the second magnetic tunnel junction MTJ1 of the second reference cell, and data of a low level is recorded in the first magnetic tunnel junction MTJ0 of the first reference cell.

Similarly, when the write enable signal WREN is enabled to a high level, data of a high level may be inputted. Then, the first and fourth switching elements P11 and N11 are turned on, and the second and third switching elements N12 and P12 are turned off. Accordingly, current flows from the first switching element P11 to the global source line GSL. In this case, in FIG. 4, data of a high level is recorded in the first magnetic tunnel junction MTJ0 of the first reference cell, and data of a low level is recorded in the second magnetic tunnel junction MTJ1 of the second reference cell.

In this way, data of a high level and a low level are recorded in the pair of reference cells through one reference cell programming operation. Further, the data stored in a selected cell of the memory cell array 110 may be read using the reference voltage VREF which is generated by the amounts of current flowing through the reference cells.

Figure 6:
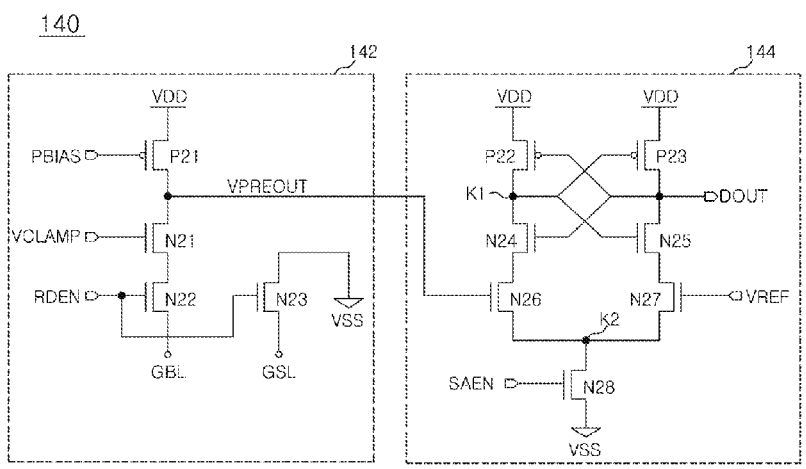
FIG. 6 is a view illustrating one exemplary embodiment of the sense amplifier shown in FIG. 3.

FIG. 6 is a view illustrating one exemplary embodiment of the sense amplifier shown in FIG. 3.

The sense amplifier 140 includes a pre-amplification section 142 and a main amplification section 144. The pre-amplification section 142 is connected to the global bit line GBL and the global source line GSL, and is configured to convert the amount of current flowing through the selected memory cell of the memory cell array 110 into a voltage value. The main amplification section 144 is configured to compare the voltage value outputted from the pre-amplification section 142 with the reference voltage VREF, and read and output the data of the selected memory cell.

As shown in FIG. 6, for example, the pre-amplification section 142 includes a first switching element P21, a second switching element N21 and a third switching element N22 which are connected between the power voltage supply terminal VDD and the global bit line GBL, and a fourth switching element N23 which is connected between the global source line GSL and the ground terminal VSS.

The first switching element P21 is driven by a bias signal PBIAS and operates as a current source of the pre-amplification section 142.

The second switching element N21 is driven by a clamp signal VCLAMP, and serves as a voltage clamp which prevents a voltage over a predetermined level from being provided to the global bit line GBL. Therefore, due to the presence of the second switching element N21, it is possible to prevent excessive current from flowing during a read operation and the magnetic tunnel junctions from being switched.

The third switching element N22 is driven by a read enable signal RDEN and causes the current applied to the global bit line GBL to be outputted as a pre-sensing signal VPREOUT.

The fourth switching element N23 serves to sink the current flowing through the global source line GSL to the ground terminal VSS.

The output signal of the first switching element P21, that is, the pre-sensing signal VPREOUT is provided to the main amplification section 144 and may be compared with the reference voltage VREF.

The main amplification section 144 may be configured by, for example, a cross-coupled differential amplifier. Referring to FIG. 6, the main amplification section 144 includes a fifth switching element P22 which is connected between the power voltage supply terminal VDD and a first node K1 and is driven by the signal applied to an output node DOUT, a sixth switching element N24 which is connected to the first node K1 and is driven by the signal applied to the output node DOUT, a seventh switching element N26 which is connected between the sixth switching element N24 and a second node K2 and is driven by the pre-sensing signal VPREOUT, an eighth switching element P23 which is connected between the power voltage supply terminal VDD and the output node DOUT and is driven by the signal applied to the first node K1, a ninth switching element which is connected to the output node DOUT and is driven by the signal applied to the first node K1, a tenth switching element N27 which is connected between the ninth switching element N25 and the second node K2 and is driven by the reference voltage VREF, and an eleventh switching element N28 which is connected between the second node K2 and the ground terminal VSS and is driven by the sense amplifier enable signal SAEN.

If the resistant state of a memory cell is a high resistant state, the amount of current flowing through the second switching element N21 becomes smaller than the amount of current flowing through the first switching element P21, and the voltage level of the pre-sensing signal VPREOUT becomes higher than the level of the reference voltage VREF. If the sense amplifier enable signal SAEN is enabled after the levels of the pre-sensing signal VPREOUT and the reference voltage VREF are stabilized, the main amplification section 144 operates, by which the eighth switching element P23 and the sixth switching element N24 are turned on and a signal of a high level is outputted to the output node DOUT.

Conversely, if the resistant state of the memory cell is a low resistant state, the voltage level of the pre-sensing signal VPREOUT becomes lower than the level of the reference voltage VREF. The fifth switching element P22 and the ninth switching element N25 are turned on and a signal of a low level is outputted to the output node DOUT.

Figure 7:
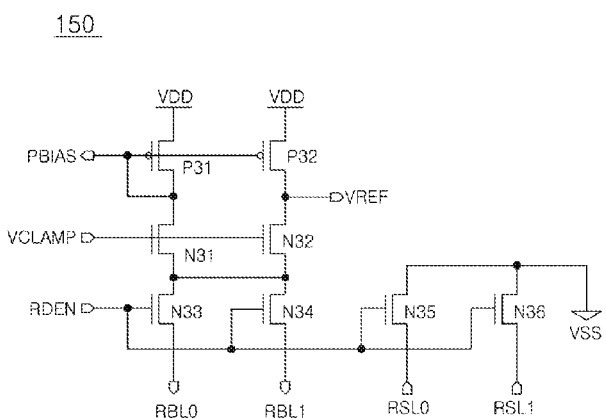
FIG. 7 is a view illustrating one exemplary embodiment of the reference voltage generation unit shown in FIG. 3.

FIG. 7 is a view illustrating one exemplary embodiment of the reference voltage generation unit shown in FIG. 3.

The reference voltage generation unit 150 is configured to generate the reference voltage VREF depending upon the amounts of current flowing through the pair of reference cells. That is to say, data of a high level and a low level are recorded in the pair of reference cells, and the reference voltage VREF is determined depending upon the amount of current corresponding to one half of the amounts of current flowing through the respective reference cells.

Referring to FIG. 7, the reference voltage generation unit 150 includes a first switching element P31, a second switching element N31 and a third switching element N33 which are connected in series between the power voltage supply terminal VDD and the first reference bit line RBL0, a fourth switching element P32, a fifth switching element N32 and a sixth switching element N34 which are connected in series between the power voltage supply terminal VDD and the second reference bit line RBL1, a seventh switching element N35 which is connected between the first reference source line RSL0 and the ground terminal VSS, and an eighth switching element N36 which is connected between the second reference source line RSL1 and the ground terminal VSS.

The first switching element P31 is diode-connected, and the second switching element N31 and the fifth switching element N32 have gate terminals to which the clamp signal VCLAMP is applied and source terminals which are shared.

The third switching element N33, the sixth switching element N34, the seventh switching element N35 and the eighth switching element N36 are driven by the read enable signal RDEN. The third and sixth switching elements N33 and N34 receive the current flowing through the first and second reference bit lines RBL0 and RBL1, respectively, such that the reference voltage VREF is generated by the second and fifth switching elements N31 and N32. Further, the seventh and eighth switching elements N35 and N36 sink the current flowing through the first and second reference source lines RSL0 and RSL1 to the ground terminal VSS.

For example, it is assumed that data of a low resistant state is recorded in the reference cell connected to the first reference bit line RBL0 and data of a high resistant state is recorded in the reference cell connected to the second reference bit line RBL1. In this case, high current I_high flows through the third switching element N33 which is connected to the first reference bit line RBL0, and low current I_low flows through the sixth switching element N34 which is connected to the second reference bit line RBL1. Since the second switching element N31 and the fifth switching element N32 share their source terminals, current of (I_high+I_low)/2 flows through the second and fifth switching elements N31 and N32, and the current at this time becomes a reference current IREF. As a result, the reference current IREF flows through the first and fourth switching elements P31 and P32, and the reference voltage VREF corresponding to the reference current IREF is outputted.

As a consequence, the level of the reference voltage VREF is determined by the voltage value of the clamp signal VCLAMP, and the bias signal PBIAS, which is generated due to flow of current through the first and fourth switching elements P31 and P32, is also provided to the pre-amplification section 142 of the sense amplifier 140, by which current mirroring is implemented such that the reference current IREF can flow to the first switching element P21 of the pre-amplification section 142.

Meanwhile, after the data are recorded in the reference cells, it is necessary to verify whether or not data are precisely recorded. Data verification in an STT-MRAM is similar to a data reading procedure, and a configuration for verifying the programming of the reference cells will be described below. While the programming of the reference cells is verified, the second through fourth switching units 170, 180 and 190 are turned off as a matter of course.

Figure 8:
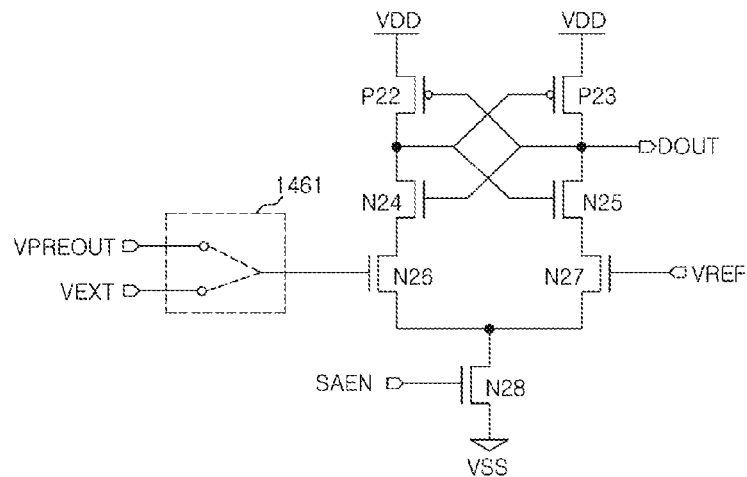
FIG. 8 is a view illustrating another exemplary embodiment of the second amplification section shown in FIG. 6.

FIG. 8 is a view illustrating another exemplary embodiment of the second amplification section shown in FIG. 6.

After data of a logic high level and a logic low level are recorded in the pair of reference cells, in order to read the data of the reference cells and thereby verify whether target data are recorded, a main amplification section 144-1 of the sense amplifier 140 may be configured as shown in FIG. 8.

Unlike the main-amplification section 144 shown in FIG. 6, the main amplification section 144-1 shown in FIG. 8 is configured to selectively receive the pre-sensing signal VPREOUT or an external power VEXT as the driving signal of the seventh switching element N26.

To this end, the main amplification section 144-1 includes a first multiplexer 1461 in addition to the configuration of the main amplification section 144 shown in FIG. 6. The first multiplexer 1461 is configured to provide the pre-sensing signal VPREOUT to the seventh switching element N26 in a normal mode and provide the external power VEXT to the seventh switching element N26 in a reference cell programming verification mode.

Accordingly, by comparing the reference voltage VREF determined depending upon the values of the data recorded in the reference cells and the external power VEXT provided to determine the level of the reference voltage VREF, it is possible to verify whether target data are recorded in the reference cells.

Figure 9:
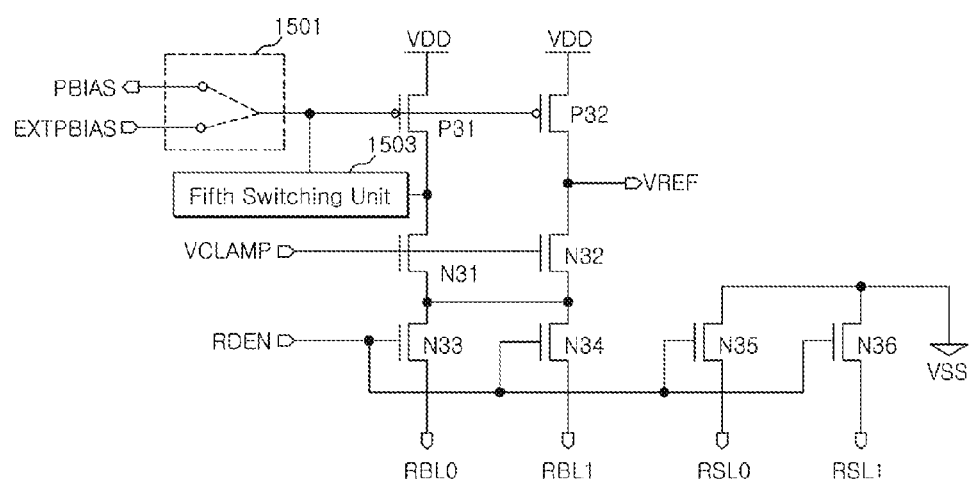
FIG. 9 is a view illustrating another exemplary embodiment of the reference voltage generation unit shown in FIG. 3.

Meanwhile, in order to verify the programming of the reference cells, the reference voltage generation unit may be configured as shown in FIG. 9.

FIG. 9 is a view illustrating another exemplary embodiment of the reference voltage generation unit shown in FIG. 3.

In the present embodiment, a reference voltage generation unit 150-1 includes a second multiplexer 1501 and a fifth switching unit 1503 in addition to the configuration of the reference voltage generation unit 150 shown in FIG. 7.

The second multiplexer 1501 causes the bias signal PBIAS to be outputted from the first switching element P31 in the normal mode. The second multiplexer 1501 provides an external bias signal EXTPBIAS to the first switching element P31 in the reference cell programming verification mode.

The fifth switching unit 1503 is connected between the gate terminal and the drain terminal of the first switching element P31. In the normal mode, the fifth switching unit 1503 causes the first switching element P31 to be diode-connected. In the reference cell programming verification mode, the fifth switching unit 1503 causes the gate terminal and the drain terminal of the first switching element P31 to be disconnected from each other.

Accordingly, the reference voltage VREF for verification of the reference cells is generated by the external bias signal EXTPBIAS, the clamp signal VCLAMP and the amounts of current flowing through the first and second reference bit lines RBL0 and RBL1 of the reference cells.

In other words, the sense amplifier 140 compares the reference voltage VREF generated by the reference voltage generation unit 150-1 shown in FIG. 9 and the external voltage VEXT and reads the data which are recorded in the reference cells.

The level of the voltage applied to the output node DOUT of the main amplification unit 144-1 of the sense amplifier 140 indicates the level of the data which are recorded in the reference cells. In the case where the potential of the output node DOUT is present between a minimum reference voltage VREFMIN and a maximum reference voltage VREFMAX which are predetermined, it may be determined that target data are recorded in the reference cells.

Accordingly, when verifying the programming of the reference cells, by performing a procedure of setting the level of the external voltage VEXT as the minimum reference voltage VREFMIN and comparing the external voltage VEXT and the reference voltage VREF and then a procedure of setting the level of the external voltage VEXT as the maximum reference voltage VREFMAX and comparing the external voltage VEXT and the reference voltage VREF, it is possible to verify whether or not the data of the reference cells are included in a reference voltage window.

Namely, after setting the level of the external voltage VEXT as the maximum reference voltage VREFMAX, by enabling the sense amplifier enable signal SAEN, the data outputted from the main amplification section 144-1 of the sense amplifier 140 is checked. As a result of the checking, if data of a high level is outputted, it may be determined that the reference voltage VREF generated from the reference voltage generation unit 150-1 is lower than the maximum reference voltage VREFMAX.

In this case, after setting the level of the external voltage VEXT as the minimum reference voltage VREFMIN, by enabling the sense amplifier enable signal SAEN, the data outputted from the main amplification section 144-1 is checked. As a result of the checking, if data of a low level is outputted, it may be determined that the reference voltage VREF generated from the reference voltage generation unit 150-1 is higher than the minimum reference voltage VREFMIN. Hence, it may be determined that target data are precisely recorded in the reference cells.

Figure 11:
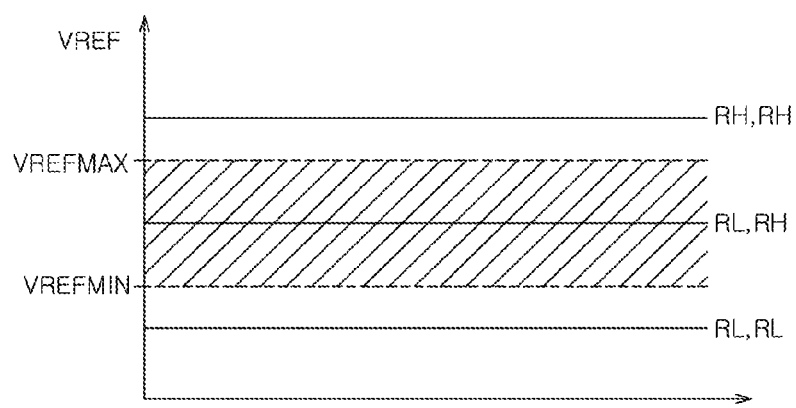
FIG. 11 is a graph showing a reference voltage window for verifying programming of reference cells.

FIG. 11 is a graph showing a reference voltage window for verifying programming of reference cells.

Referring to FIG. 11, in the case where the potential of the output node DOUT of the sense amplifier 140 is present between the minimum reference voltage VREFMIN and the maximum reference voltage VREFMAX, it may be determined that target data are recorded in the reference cells. That is to say, it is determined that the pair of reference cells have a high resistant state RH and a low resistant state RL, respectively.

In the case where the potential of the output node DOUT of the sense amplifier 140 is smaller than the minimum reference voltage VREFMIN, it may be determined that data of logic low levels are recorded in both of the pair of reference cells (RL and RL). In this case, by increasing switching current, a programming procedure for the reference cells is performed again. In the case where the potential of the output node DOUT of the sense amplifier 140 is larger than the maximum reference voltage VREFMAX, since it is meant that data of logic high levels are recorded in both of the pair of reference cells (RH and RH), a programming procedure is performed again by increasing switching current.

Figure 10:
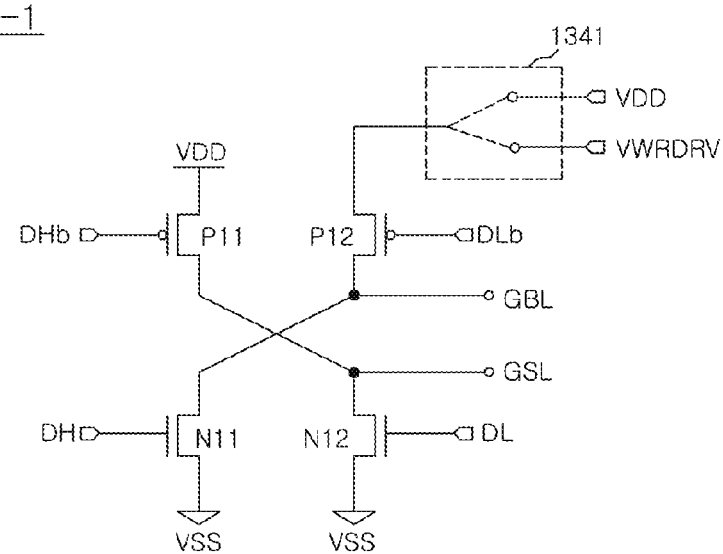
FIG. 10 is a view illustrating another exemplary embodiment of the write control section shown in FIG. 5.

In order to reprogram the reference cells, in the present invention, a write control section 134-1 as shown in FIG. 10 is proposed.

FIG. 10 is a view illustrating another exemplary embodiment of the write control section shown in FIG. 5.

The write control section 134-1 in accordance with the present embodiment of the invention includes a third multiplexer 1341 in addition to the configuration of the write control section 134 shown in FIG. 5.

The third multiplexer 1341 provides a power voltage to the third switching element P12 in a normal mode, and provides a reprogramming driving voltage VWRDRV to the third switching element P12 in a reference cell reprogramming mode.

The reprogramming driving voltage VWRDRV has a level higher than the power voltage VDD, and accordingly, when performing the reprogramming procedure for the reference cells, an amount of switching current applied to the global bit line GBL increases.

In a reprogramming operation, as in the programming operation, the first switching unit 160 is turned off, and the second through fourth switching units 170, 180 and 190 are turned on. As a consequence, programming current with the switching current increased is provided to the reference cells through the global bit line GBL of the write control section 134-1 shown in FIG. 10.

Figure 12:
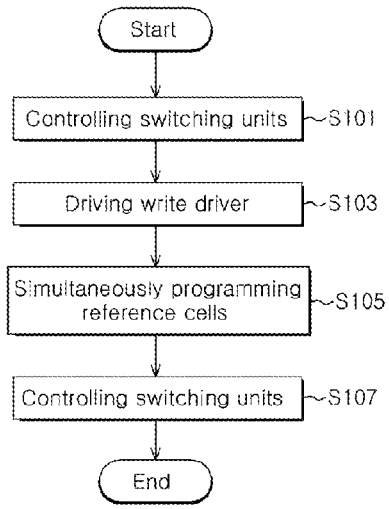
FIG. 12 is a flow chart explaining a method for programming reference cells in accordance with another embodiment of the present invention.

FIG. 12 is a flow chart explaining a method for programming reference cells in accordance with another embodiment of the present invention.

In order to prevent current flow between the memory cell array 110 and the write driver 130 and permit current flow between the write driver 130 and the reference cell array 120 so that data of a logic high state and a logic low state are simultaneously stored in the reference cells, respectively, the first switching unit 160 is turned off, and the second through fourth switching units 170, 180 and 190 are turned on (S101).

Thereafter, as the write enable signal WREN is enabled and the data signal DATA is inputted (S103), a current path is formed through the second switching unit 170, the second reference cell, the fourth switching unit 190, the first reference cell, the third switching unit 180 and the write driver 130, and data are simultaneously recorded in the pair of reference cells (S105).

If programming of the reference cells is completed, the second through fourth switching units 170, 180 and 190 are turned off (S107).

Figure 13:
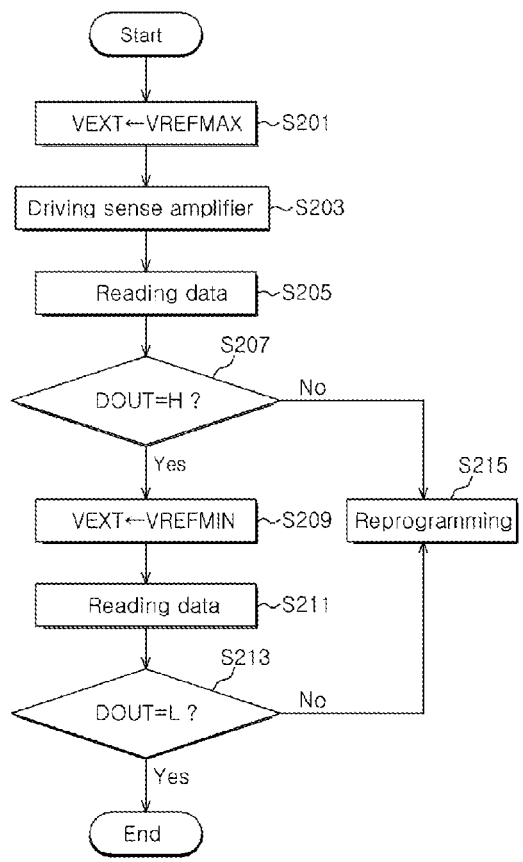
FIG. 13 is a flow chart explaining a method for verifying programming of reference cells in accordance with another embodiment of the present invention.

If the programming of the reference cells is completed in this way, a programming verification procedure for verifying whether or not target data are recorded in the reference cells is performed. FIG. 13 is a flow chart explaining a method for verifying programming of reference cells in accordance with another embodiment of the present invention.

First, the external power VEXT provided to the main amplification section 144-1 of the sense amplifier 140 is set as the maximum reference voltage VREFMAX (S201).

As the sense amplifier enable signal SAEN is enabled (S203), data are read through a procedure of comparing the maximum reference voltage VREFMAX with the reference voltage VREF generated from the reference voltage generation unit 150-1 (S205). The reference voltage generation unit 150-1 generates the reference voltage VREF corresponding to the amounts of current flowing through the reference cells by providing the external bias signal EXTPBIAS.

In the case where the potential applied to the output node DOUT of the main amplification section 144-1 has a high level (S207), the external voltage VEXT is set as the minimum reference voltage VREFMIN (S209), and data are read by comparing the minimum reference voltage VREFMIN with the reference voltage VREF (S211).

In the case where the data read in the step S211 has a low level, it is determined that target data are recorded in the reference cells, and the programming verification procedure is completed.

As a result of checking in the step S207, in the case where potential of a low level is applied to the output node DOUT of the main amplification section 144-1, that is, in the case where the amounts of current flowing through the reference cells are larger than the maximum reference voltage VREFMAX, since both of the pair of reference cells are in high resistant states, switching current is increased, and reprogramming is performed (S215).

Similarly, as a result of checking in the step S213, in the case where potential of a high level is applied to the output node DOUT of the main amplification section 144-1, it is meant that the amounts of current flowing through the reference cells are smaller than the minimum reference voltage VREFMIN. In this case, since both of the pair of reference cells are in high resistant states, switching current is increased, and a reprogramming procedure is to performed (S215).

The reprogramming procedure in the step S215 may be performed in a similar manner as described in FIG. 12.

As is apparent from the above description, in the embodiments of the present invention, logic high data and logic low data are simultaneously recorded in a pair of reference cells, respectively. If programming is completed, a preset external voltage and a reference voltage which is determined by amounts of current flowing through the reference cells are compared, and whether desired data are recorded in the reference cells is verified. In the case where precise data are not recorded in the reference cells as a result of the verification, switching current is increased, and a programming procedure for the reference cells is performed again, so that precise data can be recorded in the reference cells.

While certain embodiments have been described above, it will be understood to those skilled in the art that the embodiments described are by way of example only. Accordingly, the magnetic random access memory apparatus and the methods for programming and verifying reference cells therefor described herein should not be limited based on the described embodiments. Rather, the magnetic random access memory apparatus and the methods for programming and verifying reference cells therefor described herein should only be limited in light of the claims that follow when taken in conjunction with the above description and accompanying drawings.

What is claimed is:

1. A magnetic random access memory apparatus, comprising:
a memory cell array including a plurality of magnetic memory cells;
a reference cell array including a pair of reference magnetic memory cells;
a write driver configured to program data in the memory cell array and the reference cell array; and
a first switching unit configured to form a current path which extends from a bit line connected to the write driver via the reference cell array including the pair of reference magnetic memory cells to a source line connected to the write driver or a current path which extends from a source line connected to the write driver via the reference cell array including the pair of reference magnetic memory cells to a bit line connected to the write driver.

2. The magnetic random access memory apparatus according to claim 1, wherein the first switching unit comprises:
a first switching element connected between the source line connected to the write driver and a first reference bit line of the reference cell array;

a second switching element connected between the bit line connected to the write driver and a second reference bit line of the reference cell array; and a third switching element connected between a first reference source line and a second reference source line of the reference cell array.

3. The magnetic random access memory apparatus according to claim 1, further comprising:

a second switching unit configured to create or block a current path between the memory cell array and the write driver.

4. The magnetic random access memory apparatus according to claim 3, wherein, in a programming mode for the reference cell array, the first switching unit is turned on, and the second switching unit is turned off.

5. The magnetic random access memory apparatus according to claim 1, further comprising:

a sense amplifier configured to compare a predetermined external voltage with a reference voltage which is determined depending upon an amount of current flowing through the reference cell array.

6. The magnetic random access memory apparatus according to claim 5, wherein the sense amplifier includes a multiplexer which provides a voltage corresponding to an amount of current flowing through the memory cell array in a normal mode and provides the predetermined external voltage in a programming verification mode for the reference cell array.

7. The magnetic random access memory apparatus according to claim 5, further comprising:

a reference voltage generation unit configured to output the reference voltage which corresponds to an amount of current flowing through bit lines of the reference cell array, as a preset external bias signal is applied.

8. The magnetic random access memory apparatus according to claim 5, wherein the write driver programs the pair of reference magnetic memory cells by a first programming current in a programming mode for the reference cell array, and reprograms the pair of reference magnetic memory cells by a second programming current larger than the first programming current in response to an output signal of the sense amplifier.

9. A method for programming reference cells for a magnetic random access memory apparatus including a first switching unit which is connected between a memory cell array having a plurality of magnetic memory cells and a write driver and a second switching unit which is connected between a reference cell array having a pair of reference magnetic memory cells and the write driver and forms or blocks a current path between the reference cell array and the write driver, the method comprising the steps of:

turning off the first switching unit and turning on the second switching unit;

supplying current to flow from the write driver via the pair of reference magnetic memory cells back to the write driver; and turning off the second switching unit.

10. The method according to claim 9, wherein, in the step of supplying current, current is caused to flow from a bit line or a source line connected to the write driver via the pair of reference magnetic memory cells to a source line or a bit line connected to the write driver, and data of a logic high level and a logic low level are recorded in the pair of reference magnetic memory cells, respectively.

11. The method according to claim 10, wherein the pair of reference magnetic memory cells comprise:

a first reference magnetic memory cell connected between a first reference bit line and a first reference source line; and a second reference magnetic memory cell connected between a second reference bit line and a second reference source line, and wherein, in the step of supplying current, current supplied from the bit line of the write driver is supplied to the second reference source line via the second reference bit line and the second reference magnetic memory cell, and current of the second reference source line is supplied to the first reference magnetic memory cell and the first reference bit line through the first reference source line and is then supplied to the source line of the write driver.

12. The method according to claim 10, wherein the pair of reference magnetic memory cells comprise:

a first reference magnetic memory cell connected between a first reference bit line and a first reference source line; and a second reference magnetic memory cell connected between a second reference bit line and a second reference source line, and wherein, in the step of supplying current, current supplied from the source line of the write driver is supplied to the first reference source line via the first reference bit line and the first reference magnetic memory cell, and current of the first reference source line is supplied to the second reference magnetic memory cell and the second reference bit line through the second reference source line and is then supplied to the bit line of the write driver.

* * * * *